(12) United States Patent
Xiao et al.

(10) Patent No.: US 9,608,235 B2
(45) Date of Patent: Mar. 28, 2017

(54) THIN FILM ENCAPSULATION STRUCTURE AND ORGANIC LIGHT EMITTING DEVICE HAVING THE SAME

(71) Applicant: EverDisplay Optronics (Shanghai) Limited, Shanghai (CN)

(72) Inventors: Ling Xiao, Shanghai (CN); Guifang Li, Shanghai (CN); Niu Hu, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 15/062,573

(22) Filed: Mar. 7, 2016

(65) Prior Publication Data

US 2016/0276627 A1 Sep. 22, 2016

(30) Foreign Application Priority Data

Mar. 16, 2015 (CN) .......................... 2015 1 0114723

(51) Int. Cl.
| | |
|---|---|
| H01L 21/56 | (2006.01) |
| H01L 51/52 | (2006.01) |
| C23C 14/06 | (2006.01) |
| C23C 14/08 | (2006.01) |
| C23C 14/34 | (2006.01) |
| H01L 21/02 | (2006.01) |

(52) U.S. Cl.
CPC ...... H01L 51/5259 (2013.01); C23C 14/0652 (2013.01); C23C 14/08 (2013.01); C23C 14/081 (2013.01); C23C 14/3464 (2013.01); H01L 51/5253 (2013.01); H01L 21/022 (2013.01); H01L 21/02178 (2013.01); H01L 21/02266 (2013.01)

(58) Field of Classification Search
CPC ............. H01L 21/02178; H01L 21/022; H01L 21/02266
USPC .......................................... 257/790; 438/763
See application file for complete search history.

(56) References Cited

U.S. PATENT DOCUMENTS

2008/0053519 A1* 3/2008 Pearce ............ H01L 31/022433
136/252
2008/0233762 A1* 9/2008 Hong .................... C23C 16/405
438/763

(Continued)

FOREIGN PATENT DOCUMENTS

| CN | 101577317 A | 11/2009 |
|---|---|---|
| CN | 102437288 A | 5/2012 |

(Continued)

OTHER PUBLICATIONS

1st Office Action issued Jul. 7, 2016 by the CN Office.

Primary Examiner — George Fourson, III
(74) Attorney, Agent, or Firm — Yunling Ren

(57) ABSTRACT

The present disclosure provides a thin film encapsulation structure for encapsulating a functional device on a substrate, including: a mixing layer thin film covering the functional device, and an inorganic layer thin film located above the mixing layer thin film, wherein the mixing layer thin film is mainly composed of amorphous aluminum oxide and a crystalline oxide. The present disclosure also provides an organic light emitting device, including a substrate, an OLED device located on the substrate, and the thin film encapsulation structure as mentioned above.

14 Claims, 3 Drawing Sheets

(56) References Cited

U.S. PATENT DOCUMENTS

| | | | | |
|---|---|---|---|---|
| 2011/0048769 A1* | 3/2011 | Fujiwara | ................... | H01B 3/12 |
| | | | | 174/137 B |
| 2012/0181660 A1* | 7/2012 | Fujiwara | ........... | H01L 27/10852 |
| | | | | 257/532 |
| 2014/0026961 A1* | 1/2014 | Uebayashi | ............ | H01L 23/296 |
| | | | | 136/259 |
| 2014/0370260 A1* | 12/2014 | Uebayashi | ................ | B32B 9/00 |
| | | | | 428/218 |
| 2015/0291753 A1* | 10/2015 | Tsukamura | ........... | C23C 14/086 |
| | | | | 428/141 |
| 2015/0303317 A1* | 10/2015 | Tanaka | .............. | H01L 31/02167 |
| | | | | 136/256 |
| 2015/0337139 A1* | 11/2015 | Mori | ........................ | C08J 7/045 |
| | | | | 428/425.5 |
| 2016/0137554 A1* | 5/2016 | Sato | .......................... | C08F 2/44 |
| | | | | 428/446 |
| 2016/0328051 A1* | 11/2016 | Shishido | ................. | G06F 3/044 |

FOREIGN PATENT DOCUMENTS

| | | |
|---|---|---|
| CN | 103460433 A | 12/2013 |
| JP | 2004-22281 A | 1/2004 |

\* cited by examiner

THIN FILM ENCAPSULATION STRUCTURE AND ORGANIC LIGHT EMITTING DEVICE HAVING THE SAME

CROSS-REFERENCE TO RELATED APPLICATIONS

The present application is based upon and claims priority to Chinese Patent Application No. 201510114723.9, filed Mar. 16, 2015, the entire contents of which are incorporated herein by reference.

BACKGROUND

For an organic light emitting diode (OLED), electrons need to be injected from a cathode when the OLED is working. The material of the cathode is selected from metals having low work function, such as Al, Mg, Ag, Ca and so on. These metals are relatively active and susceptible to moisture and oxygen to react therewith. Meanwhile, other organic materials in the OLED device are also susceptible to moisture and oxygen to subject to changes, such that the natures and properties of these materials deteriorate or fail, resulting in shortening working life of the device. Therefore, in order to attain the goal of prolonging the working life of the device, it is very important to encapsulate the device efficiently so as to isolate functional layers of the device from moisture, oxygen and the like in the surrounding environment.

SUMMARY

The present disclosure provides a thin film encapsulation structure for encapsulating a functional device on a substrate, including: a mixing layer thin film covering the functional device, and an inorganic layer thin film located above the mixing layer thin film, wherein the mixing layer thin film is mainly composed of amorphous aluminum oxide and a crystalline oxide.

Further, the crystalline oxide is selected from one or more of crystalline zirconium dioxide, crystalline zinc oxide and crystalline magnesium oxide.

Further, a mass ratio between the amorphous aluminum oxide and the crystalline oxide is 3~7.

Further, the inorganic layer thin film is a $SiN_X$ thin film.

Further, the $SiN_X$ thin film is a SiN thin film or a $Si_3N_4$ thin film.

Further, a thickness of the mixing layer thin film is 50~1000 nm, and a thickness of the inorganic layer thin film is 10~1000 nm.

The present disclosure also provides a preparation method of the above thin film encapsulation structure, including: preparing the mixing layer thin film by using a facing target sputtering method, and preparing the inorganic layer thin film by using a magnetron sputtering method.

Further, a technological condition of the facing target sputtering method is: a sputtering power of 300~800 W, an argon flow of 30~80 sccm, a pressure range of 0.5~8 mTorr, an oxygen flow of 0.1~10 sccm, and a deposition time of 10 min~5 h.

Further, a technological condition of the magnetron sputtering method is: a sputtering power of 300~800 W, an argon flow of 30~80 sccm, a pressure range of 0.5~2 mTorr, and a deposition time of 10 min~5 h.

The present disclosure also provides an organic light emitting device, including a substrate, an OLED device located on the substrate, and the thin film encapsulation structure as mentioned above.

Compared with the related art, the present invention at least has the following advantageous effects. The facing target sputtering method is used in a sputtering equipment to sputter two kinds of target materials at the same time, so as to obtain the mixing layer thin film mainly composed of two kinds of materials of amorphous aluminum oxide and a crystalline oxide. And then, the magnetron sputtering method is used in the sputtering equipment to perform the inorganic layer thin film deposition. As for the protective film formed by the mixing layer thin film and the inorganic layer thin film, its film-forming is firm, compactness and uniformity are good, which can achieve the effect of encapsulating entirety and edge of the device effectively, and weight and cost of the device can be significantly reduced; the mixing layer thin film may also act as a buffer layer, so as to avoid the damage to the device during depositing the inorganic layer thin film; and in the process of depositing the thin films, the deposition condition and thickness can be easily controlled, mass production is allowed, and no poisonous gas participates in, no chemical reaction occurs, no pollutant is generated, which is friendly to the environment, and meanwhile meets the requirement on flexible OLED devices.

Figure 1:
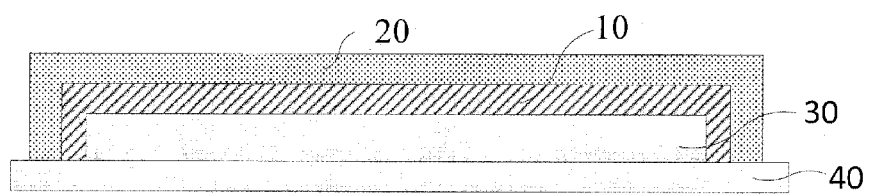
FIG. 1 is a schematic diagram of the thin film encapsulation structure according to the present disclosure.

The reference numerals are listed as follows:
10: mixing layer thin film
20: inorganic layer thin film
30: device
40: substrate
50, 50': mask
60: first target material
70: second target material
80: third target material

DESCRIPTION OF THE EMBODIMENTS

The exemplary embodiments will now be described more fully with reference to the accompanying drawings. However, the exemplary embodiments can be implemented in various forms and should not be understood as being limited to the embodiments set forth herein; on the contrary, these embodiments are provided so that this disclosure will be thorough and complete, and the conception of exemplary embodiments will be fully conveyed to those skilled in the art. In the drawings, the same reference numerals denote the same or similar structures, thus any repetitive description thereof will be omitted.

The terms "first", "second", "third" are only purely descriptive, which should not be understood as indicating or hinting the relative importance or implicitly specifying the amount of the denoted technical feature.

As shown in FIG. 1, the thin film encapsulation structure of the present invention is used for encapsulating a functional device 30 formed on a substrate 40. The functional device 30 in the present invention includes, but not limited to, an OLED device and a solar cell. When the device 30 is an OLED device, the device 30 may sequentially dispose an anode, a hole transport layer, a light emitting layer, an electron transport layer, and a cathode from bottom to top, and it may further include a hole injection layer, an electron injection layer, a TFT array substrate and the like.

The thin film encapsulation structure is mainly composed of a mixing layer thin film 10 and an inorganic layer thin film 20. The mixing layer thin film 10 and the inorganic layer thin film 20 cover a top surface and/or lateral sides of the device 30 as needed. The inorganic layer thin film 20 is located above the mixing layer thin film 10 and covers a top surface and lateral sides of the mixing layer thin film 10. The mixing layer thin film 10 is located below the inorganic layer thin film 20 and plays a role of buffering, so as to reduce the influence on the electrodes and functional layers of the device caused by the applied force of the magnetron sputtering and the stress force of the inorganic layer thin film 20 when forming the inorganic layer thin film 20. The mixing layer thin film 10 and the inorganic layer thin film 20 may be prepared by using various physical deposition methods existing in the related art, including evaporation plating, sputtering, ion plating and the like, in which the sputtering method is preferred.

The mixing layer thin film 10 is composed of amorphous aluminum oxide ($Al_2O_3$) and a crystalline oxide. The crystalline oxide may be selected from one or more of crystalline zirconium dioxide ($ZrO_2$), crystalline zinc oxide (ZnO) and crystalline magnesium oxide (MgO). After research, the present inventor finds that, if only an oxide with a crystal structure is used as the thin film encapsulation material, then the encapsulation effect is poor because the oxide with a crystal structure itself is prone to be penetrable by moisture and oxygen. In the present invention, an oxide with a crystal structure and an oxide with an amorphous structure are co-sputtered to form a thin film with an amorphous structure. In the film-forming process, amorphous $Al_2O_3$ may effectively suppress the crystalline oxide from growing along a certain crystal orientation, so that the constitution of the mixing layer thin film 10 is uniform, the structure thereof is compact, the surface roughness thereof is low, the penetration rate of moisture and oxygen is reduced, and the encapsulation effect is enhanced.

When the crystalline oxide is crystalline $ZrO_2$, for example the monoclinic system $ZrO_2$, amorphous $Al_2O_3$ may effectively suppress $ZrO_2$ crystal from growing along a certain crystal orientation, reduce the generation of defects, so that the $Al_2O_3$—$ZrO_2$ thin film presents an amorphous state integrally, the surface roughness is greatly reduced, which is beneficial to further form a compact inorganic layer thin film 20 on the surface of $Al_2O_3$—$ZrO_2$ mixing layer thin film 10, thus forming a protective layer with high compactness, effectively blocking the permeation of moisture and oxygen in the surrounding environment.

When the crystalline oxide is crystalline ZnO which typically has a hexagonal wurtzite structure or a cubic sphalerite structure, in the process of forming the mixing layer thin film 10, amorphous $Al_2O_3$ may effectively suppress ZnO crystal from growing along a certain crystal orientation, reduce the generation of defects, and the formed $Al_2O_3$—ZnO mixing layer thin film 10 has a quite high transmittance in the visible light region, whose maximum value may be up to 90%, and the formed $Al_2O_3$—ZnO mixing layer thin film 10 may be applied to a top-emitting type OLED device.

When the crystalline oxide is crystalline MgO which belongs to a NaCl structure, in the process of forming the mixing layer thin film 10, amorphous $Al_2O_3$ may effectively suppress MgO crystal from growing along a certain crystal orientation, reduce the surface roughness effectively, and the formed $Al_2O_3$—MgO mixing layer thin film 10 has good thermal stability and chemical stability, which is quite suitable for serving as the buffer layer of the inorganic layer thin film 20. Meanwhile, MgO has a certain water-absorption, which not only has good encapsulation effect in the formed thin film encapsulation structure, but also has the function of a desiccant when moisture and oxygen permeate.

The mass ratio of amorphous $Al_2O_3$ and the crystalline oxide in the mixing layer thin film 10 is about 3~7, which can be controlled by adjusting the sputtering power and oxygen flow. The thickness of the mixing layer thin film 10 is 50~1000 nm, preferably 200~600 nm.

There is no limitation to the material of the inorganic layer thin film 20 in the present invention, as long as it can block moisture and oxygen effectively. For example, it may be a thin film with the material of $TiO_2$, $SiO_2$ or $SiN_X$ and the like, preferably the $SiN_X$ thin film which has a good property to block moisture and oxygen. The $SiN_X$ thin film may be a SiN thin film or a $Si_3N_4$ thin film. The thickness of the inorganic layer thin film 20 is 10~1000 nm, preferably 200~600 nm.

Figure 2:
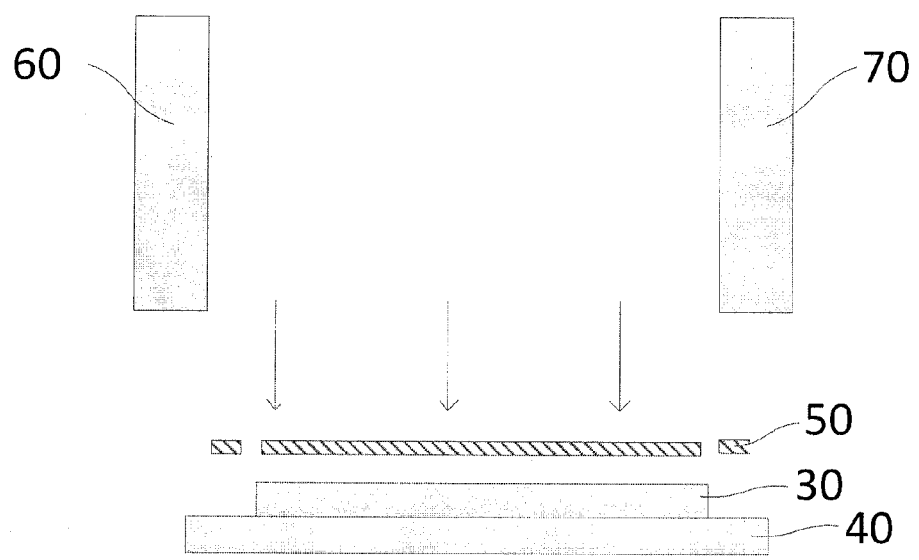
FIG. 2 is a schematic diagram of the facing target sputtering deposition according to the present disclosure.

The mixing layer thin film 10 is preferably prepared by using the facing target sputtering method in the sputtering technology. As shown in FIG. 2, one amorphous $Al_2O_3$ target material and one crystalline oxide target material are set as a first target material 60 and a second target material 70 respectively. The sizes of the first target material 60 and the second target material 70 may be, for example, 50×200 $mm^2$, 100×300 $mm^2$ or 200×300 $mm^2$ and so on. The first target material 60 and the second target material 70 are set as a facing target state in a face to face form. A mask 50 is also provided. The facing target sputtering method is used to sputter the amorphous $Al_2O_3$ target material and the crystalline oxide target material at the same time to form the mixing layer thin film 10. The purity of amorphous $Al_2O_3$ target material and crystalline oxide target material participating in the thin film deposition process is preferably 99.99%. In the sputtering process, a small amount of oxygen may be injected to supplement the oxygen content, so as to avoid the sputtering particles from lacking oxygen. The compactness of the mixing layer thin film 10 formed by using such method is high, which may block the permeation of moisture and oxygen in the surrounding environment effectively. Moreover, in the process of depositing the mixing layer thin film 10, the damage to the electrodes and functional layers of the device can be extremely reduced by using the property that the facing target sputtering method has smaller applied force to the device as compared with the magnetron sputtering method.

When the facing target sputtering method is used to deposit the mixing layer thin film 10 in the present invention, sputtering power is 300~800 W, preferably 400~600 W; argon flow is 30~80 sccm, preferably 40~60 sccm; pressure range is 0.5~8 mTorr, preferably 0.5~6 mTorr; oxygen flow is 0.1~10 sccm, preferably 0.5~8 sccm; deposition time is 10 min~5 h. Under this deposition condition, the deposition time and the sputtering power of each pair of targets are controlled to co-sputter to form the mixing layer thin film 10, and thickness of the formed mixing layer thin film 10 is 50~1000 nm, preferably 200~600 nm.

Figure 3:
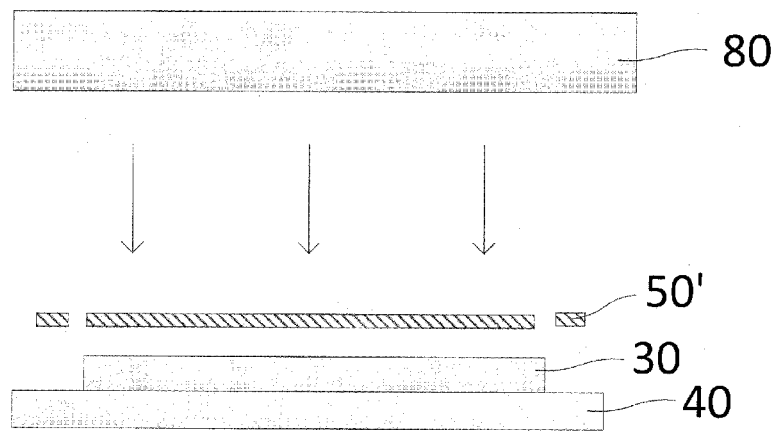
FIG. 3 is a schematic diagram of the magnetron sputtering deposition according to the present disclosure.

The inorganic layer thin film 20 is preferably prepared by using the magnetron sputtering method in the sputtering technology. As shown in FIG. 3, when the inorganic layer thin film 20 is a SiN thin film or a $Si_3N_4$ thin film, the third target material 80 is a SiN target material or a $Si_3N_4$ target material accordingly. The purity of $SiN_x$ target material participating in the thin film deposition process is preferably 99.99%. The deposited $SiN_x$ thin film 20 has good adhesion property to the substrate, the thin film is compact, which further improves the encapsulation effect, blocks the permeation of moisture and oxygen effectively, and prolongs working life of the device.

When the magnetron sputtering method is used to deposit the inorganic layer thin film 20 in the present invention, sputtering power is 300~800 W, preferably 400~600 W; argon flow is 30~80 sccm, preferably 40~60 sccm; pressure range is 0.5~2 mTorr, preferably 0.5~1.5 mTorr; deposition time is 10 min~5 h. Under this deposition condition, the deposition time and the sputtering power of the target are controlled to obtain the inorganic layer thin film 20. Thickness of the $SiN_x$ thin film 20 is 10~1000 nm, preferably 200~600 nm.

In the process of depositing the mixing layer thin film 10 and the inorganic layer thin film 20 using the sputtering technology, there is no chemical gas participating in or being released, which has no threat to the environment, and achieves the goal of environmental friendly encapsulation. As for the protective film formed by the mixing layer thin film and the inorganic layer thin film, its film-forming is firm, compactness and uniformity are good, which can achieve effective encapsulation effect, and weight and cost of the device can be significantly reduced.

First Embodiment $Al_2O_3$—$ZrO_2$/SiN Encapsulation Structure

The formation of the $Al_2O_3$—$ZrO_2$ mixing layer thin film 10: an OLED unit having electrodes and functional layers is taken as an example of the device 30. The mask 50 is arranged above the device 30, amorphous $Al_2O_3$ and crystalline $ZrO_2$ serve as the first target material 60 and the second target material 70 respectively to perform the facing target sputtering. The sputtering power is set as 300 W, argon flow is set as 30 sccm, pressure is set as 1.0 mTorr, oxygen flow is set as 0.8 sccm, and deposition time is set as 30 min. The thickness of the formed $Al_2O_3$—$ZrO_2$ mixing layer thin film 10 is about 100 nm.

The formation of the SiN thin film: the mask 50' is arranged above the device 30 deposited with the mixing layer thin film 10, and SiN serves as the third target material 80 to perform the magnetron sputtering. The sputtering power is set as 500 W, argon flow is set as 30 sccm, pressure is set as 0.9 mTorr, and deposition time is set as 30 min. The thickness of the formed SiN thin film 20 is about 80 nm.

Under the temperature of 20~25° C. and the humidity of 40~60%, the moisture-and-oxygen permeability of the OLED device with this thin film encapsulation structure is $1.2 \times 10^{-2}$ $g/m^2 \cdot day$.

Second Embodiment $Al_2O_3$—ZnO/SiN Encapsulation Structure

The formation of the $Al_2O_3$—ZnO mixing layer thin film 10: an OLED unit having electrodes and functional layers is taken as an example of the device 30. The mask 50 is arranged above the device 30, amorphous $Al_2O_3$ and crystalline ZnO serve as the first target material 60 and the second target material 70 respectively to perform the facing target sputtering. The sputtering power is set as 300 W, argon flow is set as 30 sccm, pressure is set as 1.0 mTorr, oxygen flow is set as 0.8 sccm, and deposition time is set as 30 min. The thickness of the formed $Al_2O_3$—ZnO mixing layer thin film 10 is about 100 nm.

The formation of the SiN thin film: the mask 50' is arranged above the device 30 deposited with the mixing layer thin film 10, and SiN serves as the third target material 80 to perform the magnetron sputtering. The sputtering power is set as 500 W, argon flow is set as 30 sccm, pressure is set as 0.9 mTorr, and deposition time is set as 30 min. The thickness of the formed SiN thin film 20 is about 80 nm.

Under the temperature of 20~25° C. and the humidity of 40~60%, the moisture-and-oxygen permeability of the OLED device with this thin film encapsulation structure is $1.5 \times 10^{-2}$ $g/m^2 \cdot day$.

Third Embodiment $Al_2O_3$—MgO/$Si_3N_4$ Encapsulation Structure

The formation of the $Al_2O_3$—MgO mixing layer thin film 10: an OLED unit having electrodes and functional layers is taken as an example of the device 30. The mask 50 is arranged above the device 30, amorphous $Al_2O_3$ and crystalline MgO serve as the first target material 60 and the second target material 70 respectively to perform the facing target sputtering. The sputtering power is set as 300 W, argon flow is set as 30 sccm, pressure is set as 1.0 mTorr, oxygen flow is set as 0.8 sccm, and deposition time is set as 30 min. The thickness of the formed $Al_2O_3$—MgO mixing layer thin film 10 is about 110 nm.

The formation of the $Si_3N_4$ thin film: the mask 50' is arranged above the device 30 deposited with the mixing layer thin film 10, and $Si_3N_4$ serves as the third target material 80 to perform the magnetron sputtering. The sputtering power is set as 500 W, argon flow is set as 30 sccm, pressure is set as 0.9 mTorr, and deposition time is set as 30 min. The thickness of the formed $Si_3N_4$ thin film 20 is about 80 nm.

Under the temperature of 20~25° C. and the humidity of 40~60%, the moisture-and-oxygen permeability of the OLED device with this thin film encapsulation structure is $1.0 \times 10^{-2}$ $g/m^2 \cdot day$.

The first to third embodiments are summarized in Table 1. It can be seen from Table 1 that the thin film encapsulation structures of the present disclosure have good property of blocking moisture and oxygen, which prolongs working life of the device.

TABLE 1

| | Parameter | First Embodiment | Second Embodiment | Third Embodiment |
| --- | --- | --- | --- | --- |
| Mixing layer thin film 10 | Sputtering power (W) | 300 | 300 | 300 |
| | Argon flow (sccm) | 30 | 30 | 30 |
| | Pressure (mTorr) | 1.0 | 1.0 | 1.0 |
| | Oxygen flow (sccm) | 0.8 | 0.8 | 0.8 |
| | Deposition time (min) | 30 | 30 | 30 |
| | Thickness of thin film (nm) | about 100 | about 100 | about 110 |
| Inorganic layer thin film 20 | Sputtering power (W) | 500 | 500 | 500 |
| | Argon flow (sccm) | 30 | 30 | 30 |
| | Pressure (mTorr) | 0.9 | 0.9 | 0.9 |
| | Deposition time (min) | 30 | 30 | 30 |
| | Thickness of thin film (nm) | about 80 | about 80 | about 80 |

TABLE 1-continued

| Parameter | | First Embodiment | Second Embodiment | Third Embodiment |
|---|---|---|---|---|
| Property | Permeability of moisture and oxygen ($10^{-2}$ g/m² · day) | 1.2 | 1.5 | 1.0 |

Although an example of encapsulating the OLED device is taken to describe the thin film encapsulation structure of the present disclosure, it will be appreciated that the thin film encapsulation structure of the present disclosure may also be applied in the same or similar encapsulation or seal technology to encapsulate or seal an element or a device. It should be understood that the present disclosure is not limited to the disclosed embodiments. Instead, the present disclosure is intended to encompass various modifications and equivalent arrangements within the scope of the appended claims.

What is claimed is:

1. A thin film encapsulation structure for encapsulating a functional device on a substrate, comprising: a mixing layer thin film covering the functional device, and an inorganic layer thin film located above the mixing layer thin film, wherein the mixing layer thin film is mainly composed of amorphous aluminum oxide and a crystalline oxide.

2. The thin film encapsulation structure according to claim 1, wherein, the crystalline oxide is selected from one or more of crystalline zirconium dioxide, crystalline zinc oxide and crystalline magnesium oxide.

3. The thin film encapsulation structure according to claim 1, wherein, a mass ratio between the amorphous aluminum oxide and the crystalline oxide is 3~7.

4. The thin film encapsulation structure according to claim 1, wherein, the inorganic layer thin film is a $SiN_X$ thin film.

5. The thin film encapsulation structure according to claim 4, wherein, the $SiN_X$ thin film is a SiN thin film or a $Si_3N_4$ thin film.

6. The thin film encapsulation structure according to claim 2, wherein, the inorganic layer thin film is a $SiN_X$ thin film.

7. The thin film encapsulation structure according to claim 6, wherein, the $SiN_X$ thin film is a SiN thin film or a $Si_3N_4$ thin film.

8. The thin film encapsulation structure according to claim 3, wherein, the inorganic layer thin film is a $SiN_X$ thin film.

9. The thin film encapsulation structure according to claim 8, wherein, the $SiN_X$ thin film is a SiN thin film or a $Si_3N_4$ thin film.

10. The thin film encapsulation structure according to claim 1, wherein, a thickness of the mixing layer thin film is 50~1000 nm, and a thickness of the inorganic layer thin film is 10~1000 nm.

11. A preparation method of a thin film encapsulation structure, the thin film encapsulation structure being used for encapsulating a functional device on a substrate, and comprising: a mixing layer thin film covering the functional device, and an inorganic layer thin film located above the mixing layer thin film, wherein the mixing layer thin film is mainly composed of amorphous aluminum oxide and a crystalline oxide,
wherein the preparation method comprises:
preparing the mixing layer thin film by using a facing target sputtering method; and
preparing the inorganic layer thin film by using a magnetron sputtering method.

12. The preparation method of the thin film encapsulation structure according to claim 11, wherein, a technological condition of the facing target sputtering method is: a sputtering power of 300~800 W, an argon flow of 30~80 sccm, a pressure range of 0.5~8 mTorr, an oxygen flow of 0.1~10 sccm, and a deposition time of 10 min~5 h.

13. The preparation method of the thin film encapsulation structure according to claim 11, wherein, a technological condition of the magnetron sputtering method is: a sputtering power of 300~800 W, an argon flow of 30~80 sccm, a pressure range of 0.5~2 mTorr, and a deposition time of 10 min~5 h.

14. An organic light emitting device, comprising a substrate, an OLED device located on the substrate, and a thin film encapsulation structure,
wherein the thin film encapsulation structure is used for encapsulating the OLED device, and comprises: a mixing layer thin film covering the OLED device, and an inorganic layer thin film located above the mixing layer thin film, wherein the mixing layer thin film is mainly composed of amorphous aluminum oxide and a crystalline oxide.

* * * * *